United States Patent [19]
Kim et al.

[11] Patent Number: 5,219,792
[45] Date of Patent: Jun. 15, 1993

[54] METHOD FOR FORMING MULTILEVEL INTERCONNECTION IN A SEMICONDUCTOR DEVICE

[75] Inventors: Jang-rae Kim, Seoul; Han-su Kim, Kyunggi, both of Rep. of Korea

[73] Assignee: Samsung Electronics Co., Ltd., Kyunggi, Rep. of Korea

[21] Appl. No.: 732,107

[22] Filed: Jul. 18, 1991

[30] Foreign Application Priority Data

Jan. 14, 1991 [KR] Rep. of Korea .................. 91-450

[51] Int. Cl.⁵ .......................................... H01L 21/441
[52] U.S. Cl. .................................. 437/195; 437/189; 437/978; 148/DIG. 43
[58] Field of Search ............ 437/195, 190, 978, 189; 148/DIG. 43

[56] References Cited

U.S. PATENT DOCUMENTS 4,977,105 12/1990 Okamoto et al. ............... 437/195 X
5,086,016 2/1992 Brodsky et al. ................. 437/190

Primary Examiner—John S. Maples
Attorney, Agent, or Firm—Cushman, Darby & Cushman

[57] ABSTRACT

Disclosed is a method for manufacturing a semiconductor device. A multilevel interconnection process for forming a via hole on the first layer electrode and then forming the second layer electrode, comprises the steps of forming the first dielectric layer on the whole surface of the semiconductor substrate where the first layer electrode has been formed, filling the re-entrant by forming the insulating material on the first dielectric layer, laminating a second dielectric layer on the first dielectric layer and the insulating material, forming a via hole by carrying out the photolithography process on the second dielectric layer formed on the first layer electrode, forming an insulating layer on the whole surface of the semiconductor substrate where the via hole has been formed, leaving the spacer on the side wall of the via hole by anisotropically etching the insulating layer, depositing the conductive material on the inside of the via hole whose side wall is enclosed by the spacer and on the whole surface of the second dielectric layer, and patterning the conductive material as a desirable conductive layer shape. Thus, the several problems due to overetching and underetching of the conventional SOG layer can be solved and the slope of the via hole is smaller, thereby improving the step coverage of the conductive material filling the via hole.

23 Claims, 3 Drawing Sheets

METHOD FOR FORMING MULTILEVEL INTERCONNECTION IN A SEMICONDUCTOR DEVICE

BACKGROUND OF THE INVENTION

The present invention relates to a method for manufacturing a semiconductor device and particularly to a method for forming the multilevel interconnection of a semiconductor device in which after a spacer made of an insulating material is formed on the side wall of the via hole, a second layer electrode is then formed.

Along with the miniaturization of LSI, several physical limitation problems appear in relation to the contacts. Among them are: broken conductive layers caused by the increase in geometric step, electromigration of the conductive material generated by miniaturization of the device and high resistance of the conductive layers, and stress migration.

The multilevel interconnection technique is suggested to solve the problems due to the miniaturization of the conductive layer in order to manufacture highly reliable and highly integrated semiconductor devices. This technique comprises the steps of forming an interlayer insulating layer by forming an insulating material on a semiconductor substrate on which a first layer electrode has been formed; forming a via hole by partially removing the interlayer insulating layer formed on the first layer electrode; and forming a second layer electrode by filling the via hole with conductive material.

Generally, in the multilevel interconnection technique, the second layer electrode is formed on the interlayer insulating layer which repeats the uneven surface formed by the first layer electrode, so that the topographical-like surface becomes larger than in the first layer electrode. Thus, since several problems are generated by the topographical-like surface, the uneven surface problem is overcome by carrying out the planarization process on the interlayer insulating layer first, and then forming the second layer electrode.

Referring to FIGS. 1A and 1B, the conventional method for planarizing an interlayer insulating layer and the conventional method for forming a second layer electrode by filling the via hole is illustrated.

The accompanying drawings are based on a semiconductor device where two transistors having one drain region 16 in common are formed on the semiconductor substrate 10 defined as an active region and a conductive material is then deposited on the source region 14 and the drain region 16 of the transistor to form a first layer electrode. At this time, the multilevel interconnection process is carried out to electrically connect the source region 14 of each transistor, the first layer electrodes 20 formed on the source region 14 of each transistor and the second layer electrode formed on the interlayer insulating layer.

First of all, a first dielectric layer 22 is formed on the semiconductor substrate 10 where the first layer electrodes 20 have been formed. Then, an insulating material such as a SOG (Spin-On-Glass) layer 24 is thickly formed on the whole surface of the first dielectric layer, is baked through a thermal process at a temperature of approximately 150° C. to 450° C. and is then etched back by anisotropic etching, thereby filling a re-entrant formed by the first layer electrode. At this time, the etching process is carried out until the surface of the first dielectric layer is exposed (refer to FIG. 1A). A second dielectric layer is formed in sequence on the whole surface of the semiconductor substrate where the re-entrant has been filled by the SOG layer, thereby completing the interlayer insulating layer. At this time, the interlayer insulating layer is constituted by the first dielectric layer, the SOG layer and the second dielectric layer, and is planarized by the second dielectric layer formed on the first dielectric layer where the reentrant is filled by the SOG layer. The via hole is then formed by partially removing the interlayer insulating layer laminated on the first layer electrode by a photolithography process and a conductive layer is formed by filling the via hole, depositing the conductive material on the whole surface of the semiconductor substrate, and patterning the deposited conductive material, thereby completing the second layer electrode 28.

In the method for forming the multilevel interconnection to form the second layer electrode after the planarization of the interlayer insulating film, the second layer electrode is formed on the planarized interlayer insulating layer by first planarizing the interlayer insulating layer by filling the re-entrant with the SOG layer and thus overcome the topographical effect due to the first layer electrode; thereby, overcoming the low reliability of the multilevel interconnection due to the uneven surface. However, since the etching ratio of the SOG layer to the dielectric layer is unequal in the planarization process, several problems are generated. Referring to FIGS. 2 and 3, the problems will be described.

FIG. 2 shows that the SOG layer is overetched due to the different etching ratios between the first dielectric layer and the SOG layer, when the SOG layer thickly coated on the first dielectric layer 22 is anisotropically etched. Generally, the SOG layer is thickly coated on the whole surface of the first dielectric layer, and is then baked through a thermal process at a temperature of approximately 150° C. to 450° C., while is to facilitate the following process by removing the water contained in the SOG layer through the baking process. At this time, the carbon content of the SOG layer is varied according to the temperature of the baking process and the etching ratio is varied according to the carbon content of the SOG layer. Generally, as the temperature is high, the carbon content of the SOG layer is small, and as the carbon content is small, the etching speed becomes faster than that of the first dielectric layer.

To make the etching rates of the SOG layer and the first dielectric layer equal, the baking process should be carried out by properly controlling the thermal processing temperature. But, since the conditions to be controlled are very difficult, as shown in FIG. 2, the re-entrant is not filled by the overetched SOG layer 24a and can remain. If the interlayer insulating layer is completed by forming the second dielectric layer when the re-entrant is not filled by the overetched SOG layer, the desirable planarization effect of the interlayer insulating layer by the SOG layer can not be obtained, so that problems are generated such as the electric opening of the conductive layer due to the voids of the conductive layer of the second layer electrode when the conductive material is deposited to form the second layer electrode on the interlayer insulating layer.

FIG. 3 shows that a thin SOG layer 24b is left on the first layer electrode where the via hole will be formed, since the SOG layer is underetched. In the conventional method for planarizing the interlayer insulating layer by filling the re-entrant, the material filled in the re-entrant is thickly coated on the whole surface of the first dielectric layer, and then etched-back until the upper surface of the first dielectric layer is exposed. This is to prevent hindering the formation of the highly reliable second layer electrode due to the several problems resulting from the non-etched and remaining materials on the first dielectric layer. The SOG layer used as the material for filling the re-entrant in the device shown in FIG. 2 has a property for strongly absorbing water. Accordingly, being exposed in air, the SOG layer absorbs the water contained in the air. As the SOG layer has the property of increasing volume by absorbing the water, it also decreases in volume under contrary conditions. In more detail as shown in FIG. 3, when the SOG layer is exposed in the air on the side wall of the via hole, the volume is expanded by the absorption of the water contained in the air, so that the adhesive between the first dielectric layer and second dielectric layer becomes weak and may destroy the laminated structure. When the second layer electrode is formed by depositing the conductive material on the via hole where the SOG layer has been exposed, the water contained in the SOG layer is moved to the conductive material constituted by the second layer electrode, thereby corroding the conductive layer and deteriorating the reliability of the semiconductor device.

SUMMARY OF THE INVENTION

It is an object of the present invention to provide a method for forming a multilevel interconnection in a semiconductor device which forms a spacer of an insulating material on the side wall of the via hole and then forms the second layer electrode, to form a highly reliable multilevel interconnection by solving the several problems generated in the conventional method of forming a multilevel interconnection.

To achieve the above object of the present invention, a multilevel interconnection method for forming the via hole on the first layer electrode first and then forming the second layer electrode comprises:

forming a first dielectric layer on the whole surface of the semiconductor substrate where the first layer electrode has been formed;

filling the re-entrant by forming the insulating material on the first dielectric layer;

laminating the second dielectric layer on the first dielectric layer and the insulating material;

forming a via hole by carrying out the photolithography process on the second dielectric layer formed on the first layer electrode;

forming an insulating layer on the whole surface of the semiconductor substrate where the via hole has been formed;

leaving the spacer on the side wall of the via hole by anisotropically etching the insulating layer;

depositing the conductive material on the inside of the via hole whose side wall is enclosed by the spacer and the whole surface of the second dielectric layer; and patterning the conductive material to the desirable conductive layer shape.

BRIEF DESCRIPTION OF THE DRAWINGS

The above object and other advantages of the present invention will become more apparent by describing the preferred embodiment of the present invention with reference to the attached drawings, in which.

DETAILED DESCRIPTION OF THE INVENTION

Hereinafter, the present invention will be described in more detail with reference to FIGS. 4A through 4D wherein is shown the method for forming the multilevel interconnection of the semiconductor device, according to the present invention.

The method for forming the multilevel interconnecting uses the semiconductor substrate whose pattern is the same as that used for explaining the conventional method for forming multilevel interconnection, where two transistors having one common drain region 16 are formed on one active region, and a first layer electrode 20 is formed on the source region 14 and the drain region 16 of each transistor.

Figure 1A:
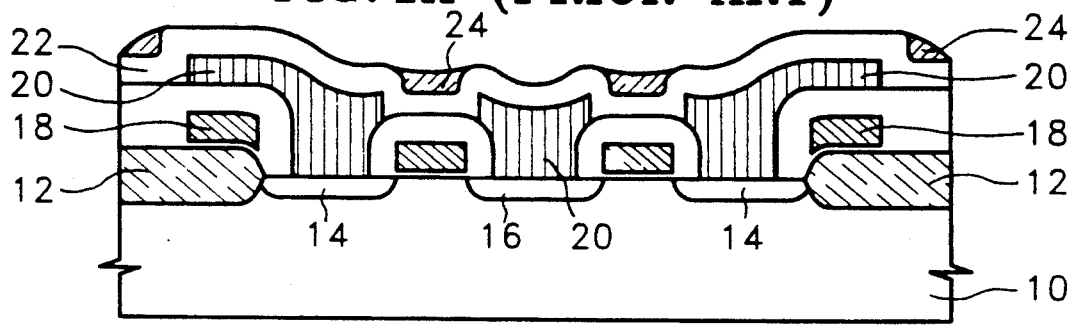
FIGS. 1A and 1B are sectional views showing the conventional method for forming the multilevel interconnection of the semiconductor device.
Figure 1B:
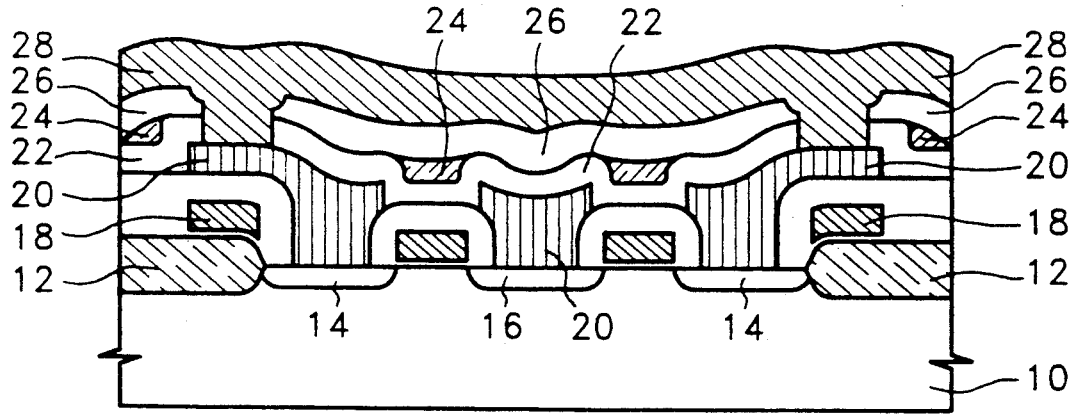
Figure 2:
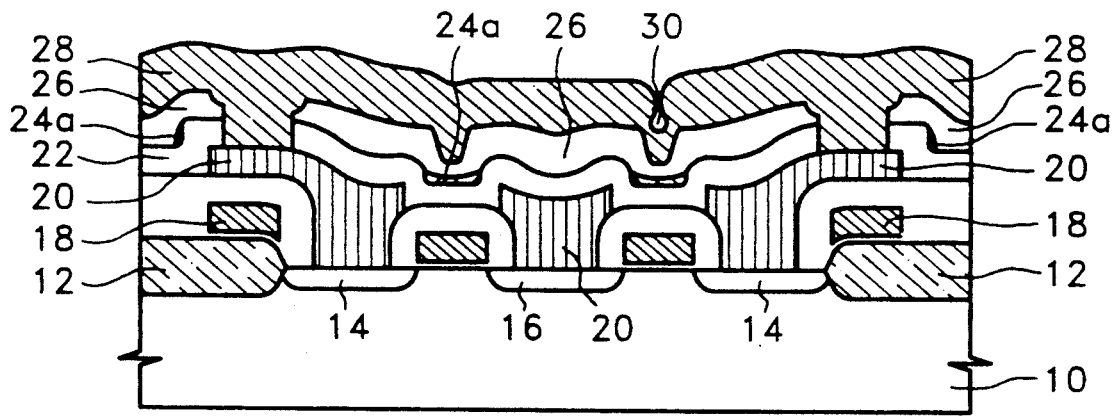
FIG. 2 is a sectional view showing the overetched interlayer insulating material in the conventional method for forming the multilevel interconnection of the semiconductor device.
Figure 3:
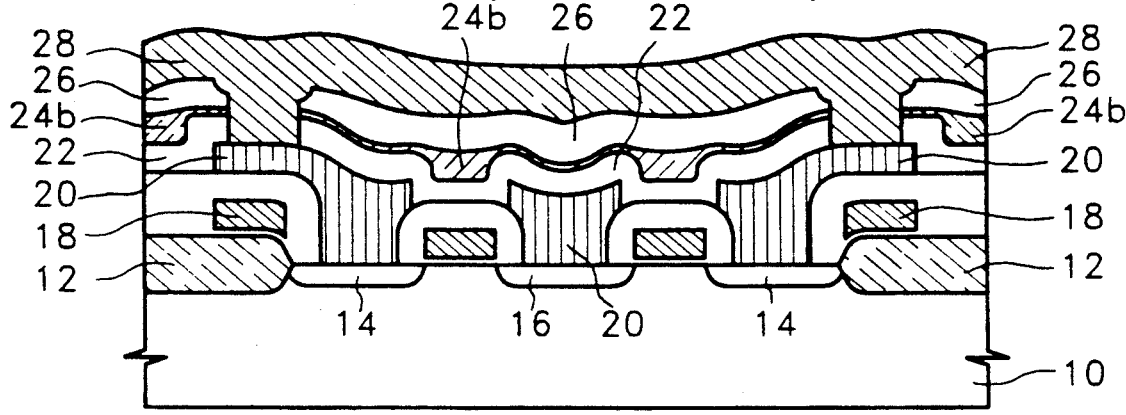
FIG. 3 is a sectional view showing that the interlayer insulating material is underetched in the conventional method for forming the multilevel interconnection of the semiconductor device.
Figure 4A:
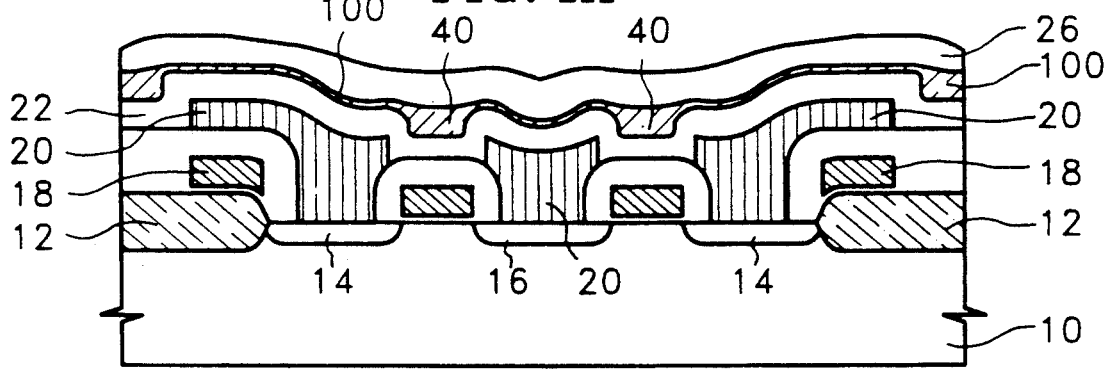
FIGS. 4A through 4D are sectional views showing the method for forming multilevel interconnection of the semiconductor device, according to the present invention.

First of all, FIG. 4A shows the step for forming the planarized interlayer insulating layer by laminating the first dielectric layer 22, the insulating material 100 and the second dielectric layer 26 on the whole surface of the semiconductor substrate where the first layer electrodes 20 have been formed. In detail, the first dielectric layer 22, being material such as $SiO_2$ or TEOS (tetraethyl orthosilicate), is deposited to a thickness of approximately 2000Å to 6000Å by the plasma enhanced chemical vapor deposition (PECVD) method on the whole surface of the semiconductor substrate where the first layer electrodes 20 have been formed. The insulating material such as a SOG layer is deposited to a thickness of approximately 500Å to 4000Å on the whole surface of the first dielectric layer 22, and the water contained within the SOG layer is then evaporated and at the same time the carbon content is controlled through the baking process.

At this time, the insulating material, i.e., the SOG layer, is formed through one or more times of the depositing and baking steps. Several depositings and baking processes are to prevent the crack phenomenon which might occur when the thickly deposited SOG layer is baked once. Since it is not necessary that the SOG layer deposited in the depositing and baking process is completely removed from the upper surface of the first dielectric layer as in the conventional method, any other etching back process is not needed to remove the SOG layer remaining on the upper surface of the first dielectric layer.

In sequence, the second dielectric layer 26 formed with PSG(Phosphorous Silicate Glass) or TEOS is deposited to a thickness of approximately 2000Å to 6000Å by a depositing method such as the PECVD method, thereby completing the planarized interlayer insulating layer. At this time, the thickness of the first layer electrode is about 5000Å to 9000Å.

Figure 4B:
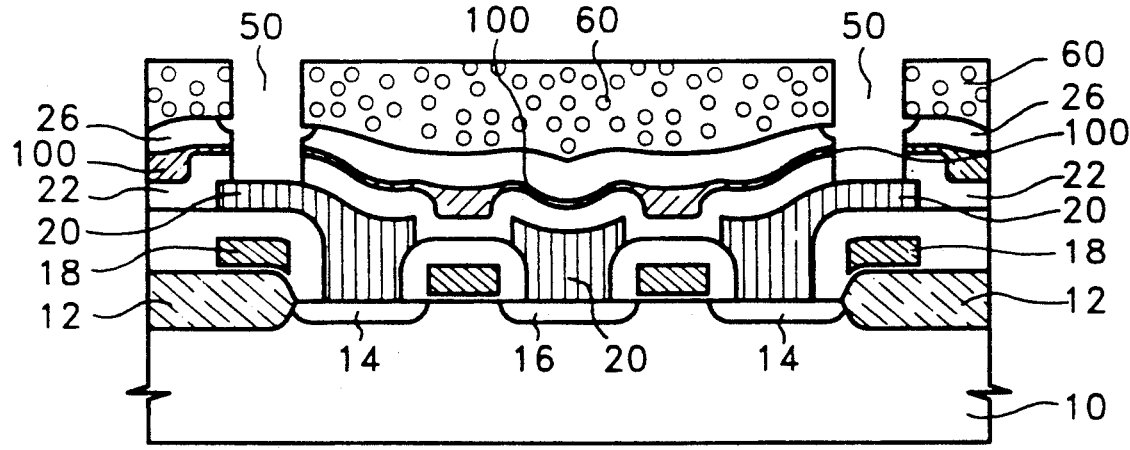

Referring to FIG. 4B, following the formation of the photoresist pattern 60 for forming the via hole on the interlayer insulating layer, the step for forming the via hole by carrying out the photolithography process occurs. After the photoresist is formed with a predetermined thickness on the whole surface of the second dielectric layer 26, the photoresist pattern 60 for forming the via hole is formed.

In sequence, the second dielectric layer 26 is etched, for instance, with the thickness of approximately 1000Å to 5000Å, by isotropically etching the second dielectric layer 26 exposed by the photoresist pattern 60, and the first dielectric layer, the insulating material and the second dielectric layer laminated on the first layer electrode are removed by carrying out anisotropic etching, thereby completing the via hole 50. At this time, the reason why the isotropic etching and the anisotropic etching are used together in the via hole forming step is that the step coverage of the conductive material which will fill the via hole and become a second layer electrode can be improved since the via hole entrance can be formed in flare by the isotropic etching process.

Figure 4C:
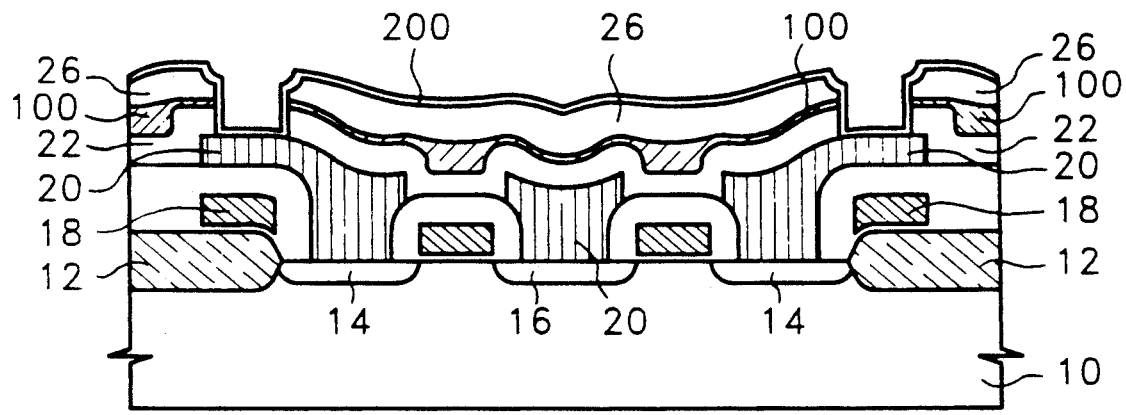

FIG. 4C shows the process for forming the thin insulating layer 200 on the whole surface of the second dielectric layer 26 where the via hole has been formed. The insulating layer 200 is formed by depositing an insulating material such as $SiO_2$ or TEOS by the PECVD method to a thickness of 500Å to 1500Å.

Figure 4D:
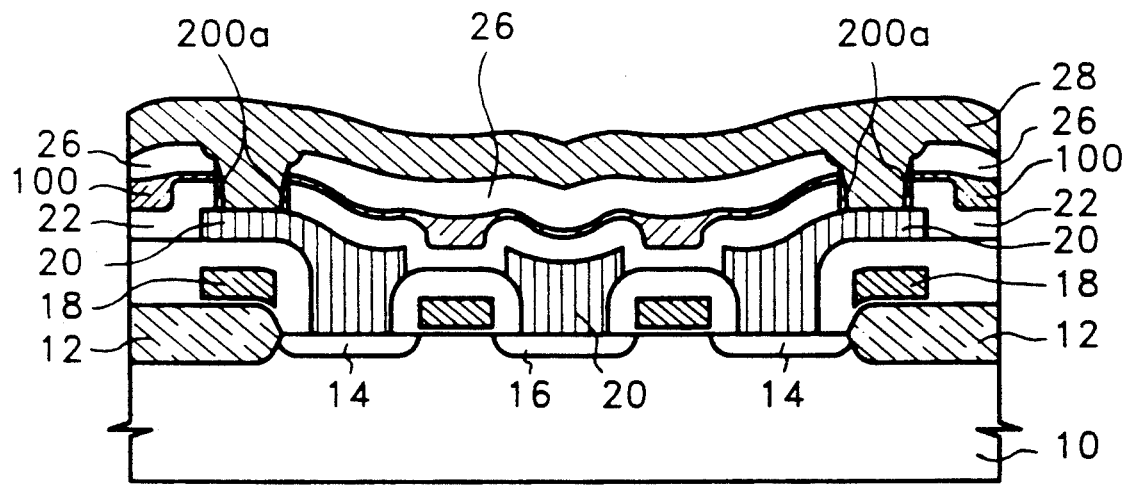

Referring to FIG. 4D, the second layer electrode is formed by forming the spacer 200a on the side wall of the via hole by anisotropically etching the insulating layer 200 and depositing the conductive material on the whole surface of the semiconductor substrate. When the insulating layer 200 is anisotropically etched, the spacer 200a is a part of the remaining insulting layer which is not removed on the side wall of the via hole. Generally, if a material is etched by anisotropic etching, the material coated in the vertical direction with respect to the etching direction is removed well, but the material coated in the horizontal direction is not removed well and remains on the side wall of the step to form the spacer.

In the present method, the spacer 200a formed on the side wall of the via hole prevents the absorption of the water when the insulating material 100 is exposed in air, thereby preventing the expansion of the volume of the insulating material 100 due to the absorption of the water. Also, since the material constituting the spacer 200a is the same as those for the first dielectric layer 22 and the second dielectric layer 26, the eminent adhesive to the layers prevents destruction of the laminated structure between the material layers due to the different thermal expansion coefficients, thereby forming a highly reliable multilevel interconnection structure. The spacer 200a has the effect of decreasing the slope of the via hole, thereby increasing the step coverage of the conductive material deposited on the via hole. Thus, the problems such as the voids which might be formed on the narrow via hole can be solved. Generally, the top of spacer is sharp and the width of the bottom of it is wide, so that the step coverage compensating effect is obvious.

Accordingly, the electric characteristic break of the device by overetching or underetching the SOG layer which is the problem in the planarization process of the interlayer insulating layer for forming the conventional multilevel interconnection can be reduced, so that a convenient and highly reliable multilevel interconnection can be formed. After the SOG layer laminated on the first dielectric layer is baked, the etching back process for planarization can be freely inserted or removed, so that problems due to the physical characteristics of the conventional SOG layer or the difference between the physical characteristics of the SOG layer and the first and second dielectric layers are solved and the improved step coverage due to the decreased slope of the via hole can alleviate the problem of the broken conductive layers due to the formation of the voids or the migration generated in the step.

It is obvious that the present invention is not limited to the above described embodiments and modifications can be made by those skilled in the art without departing from the scope of the invention as set forth in the appended claims.

What is claimed is:

1. A method for forming multilevel interconnection of a semiconductor device for forming a via hole on a first layer electrode and then forming a second layer electrode, comprising the steps of:
   forming a first dielectric layer on the whole surface of the semiconductor substrate where the first layer electrode is formed;
   filling an re-entrant by forming an insulating material on said fist dielectric layer;
   laminating a second dielectric layer on said first dielectric layer and said insulating material;
   forming said via hole by carrying out a photolithography process on said second dielectric layer formed on said first layer electrode;
   forming an insulating layer on the whole surface of the semiconductor substrate where said via hole has been formed;
   leaving a spacer on a side wall of the via hole by anisotropically etching said insulating layer;
   depositing a conductive material on the inside of said via hole whose side wall is enclosed by said spacer and on the whole surface of said second dielectric layer; and
   pattering said conductive material to the desirable conductive layer shape.

2. A method for forming multilevel interconnection of a semiconductor device as claimed in claim 1, wherein the thickness of said first layer electrode is about 0.5 to -0.9μm.

3. A method for forming multilevel interconnection of a semiconductor device as claimed in claim 1, wherein said first dielectric layer is one of $SiO_2$, TEOS, and PSG.

4. A method for forming multilevel interconnection of a semiconductor device as claimed in claim 3, wherein said first dielectric layer is formed by a plasma enhanced chemical vapor deposit.

5. A method for forming multilevel interconnection of a semiconductor device as claimed in claim 3, wherein said first dielectric layer is deposited to a thickness of 0.2 to 0.6μm.

6. A method for forming multilevel interconnection of a semiconductor device as claimed in claim 1, wherein said insulating material is a SOG layer.

7. A method for forming multilevel interconnection of a semiconductor device a claimed in claim 6, wherein said insulating material is coated through at least one coating process.

8. A method for forming multilevel interconnection of a semiconductor device as claimed in claim 6, wherein said insulating material is formed to a thickness of 0.05 to 0.4μm.

9. A method for forming multilevel interconnection of a semiconductor device as claimed in claim 6, wherein said second dielectric layer is self-planarized by forming said insulating material and filling said re-entrant through the etch-back process.

10. A method for forming multilevel interconnection of a semiconductor device as claimed in claim 9, wherein said etch-back process is carried out until a surface of said first dielectric layer is exposed.

11. A method for forming multilevel interconnection of a semiconductor device as claimed in claim 9, wherein said etch-back process is carried out, so that the insulating material is left on said first dielectric layer.

12. A method for forming multilevel interconnection of a semiconductor device as claimed in claim 6, wherein said insulating material is directly deposited without a etch-back process.

13. A method for forming multilevel interconnection of a semiconductor device as claimed in claim 6, wherein said insulating material self-planarizes said second dielectric layer by repeating a coating/baking process.

14. A method for forming multilevel interconnection of a semiconductor device as claimed in claim 1, wherein said second dielectric layer is the same material as that of the first dielectric layer.

15. A method for forming multilevel interconnection of a semiconductor device as claimed in claim 14, wherein said second dielectric layer is deposited to a thickness of 0.2 to 0.6μm.

16. A method for forming multilever interconnection of a semiconductor device as claimed in claim 1, wherein in said etching step for forming an via hole, the isotropic etching is carried out first and an anisotropic etching is then carried out.

17. A method for forming multilevel interconnection of a semiconductor device as claimed in claim 16, wherein said isotropic etching is carried out until the edge part of the second dielectric layer in contact with the via hole is etched by 0.1 to 0.5μm.

18. A method for forming multilevel interconnection of a semiconductor device as claimed in claim 1, wherein said via hole has the size of submicron.

19. A method for forming multilevel interconnection of a semiconductor device as claimed in claim 1, wherein the size of said via hole is about 0.6 to 1.5μm.

20. A method for forming multilever interconnection of a semiconductor device as claimed in claim 1, wherein said insulating layer is the same material as those of the first dielectric layer and the second dielectric layer.

21. A method for forming multilevel interconnection of a semiconductor device as claimed in claim 20, wherein said insulating layer is deposited to a thickness of 0.05 to 0.15μm.

22. A method for forming multilevel interconnection of a semiconductor device as claimed in claim 1, wherein the conductive material for forming said first layer electrode and said second layer electrode is a low resistance conductive material.

23. A method for forming multilevel interconnection of a semiconductor device as claimed in claim 1, wherein the conductive material for forming said first layer electrode and said second layer electrode is a metal having a high melting point.

* * * * *